(12) United States Patent
Morton et al.

(10) Patent No.: US 8,461,901 B1
(45) Date of Patent: Jun. 11, 2013

(54) HARMONIC REJECT MIXER WITH ACTIVE PHASE MISMATCH COMPENSATION IN THE LOCAL OSCILLATOR PATH

(75) Inventors: Matthew A. Morton, Reading, MA (US); Jonathan P. Comeau, Winchester, MA (US); Edward Wade Thoenes, Cambridge, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/399,221

(22) Filed: Feb. 17, 2012

(51) Int. Cl.
   *H03D 13/00* (2006.01)
(52) U.S. Cl.
   USPC .......................... 327/355; 455/323
(58) Field of Classification Search
   USPC ..................... 327/335–361; 455/323, 326
   See application file for complete search history.

(56) References Cited

U.S. PATENT DOCUMENTS

| | | | |
|---|---|---|---|
| 6,317,589 B1 * | 11/2001 | Nash | 455/245.2 |
| 7,164,901 B2 * | 1/2007 | Zheng et al. | 455/324 |
| 7,190,943 B2 * | 3/2007 | Davis | 455/313 |
| 7,251,298 B1 * | 7/2007 | Hietala et al. | 375/340 |

* cited by examiner

*Primary Examiner* — Dinh T. Le
(74) *Attorney, Agent, or Firm* — Daly, Crowley, Mofford & Durkee, LLP

(57) ABSTRACT

A harmonic rejection mixer having a phase rotator fed by a local oscillator signal. The local oscillator signal has a reference frequency. The phase rotator produces a plurality of output signals, each one of the signals having a common frequency related to the reference frequency and having different relative phase shifts. A plurality of mixer sections, each one of the sections being fed an input signal and a corresponding one of the plurality of output signals mixes the local oscillator signal with the corresponding one of the plurality of output signals fed thereto. A combiner combines the mixer signal from the plurality of mixer sections into a composite output signal. A detector detects energy in a harmonic of the composite signal and for adjusting the output signal of the phase rotator to reduce the selected harmonic of the composite signal.

2 Claims, 9 Drawing Sheets

HARMONIC REJECT MIXER WITH ACTIVE PHASE MISMATCH COMPENSATION IN THE LOCAL OSCILLATOR PATH

TECHNICAL FIELD

This disclosure relates generally to harmonic reject mixer and more particularly to harmonic reject mixer having active phase mismatch compensation in the local oscillator path.

BACKGROUND AND SUMMARY

As is known in the art, switching mixers are frequently used in RF design, and in order to make the switches turn on and off quickly and cleanly these mixers are frequently driven with a large local oscillator (LO) signal such that the signal is compressed. More particularly, the LO signal is a square wave or a very large sinusoidal signal, such that the input voltage swing is larger than the linear region of the transistors. Once the linear region of the transistor is exceeded, the voltage swing will be compressed and appear more like a square wave as the odd-order harmonics increase in power.

Figure 1A:
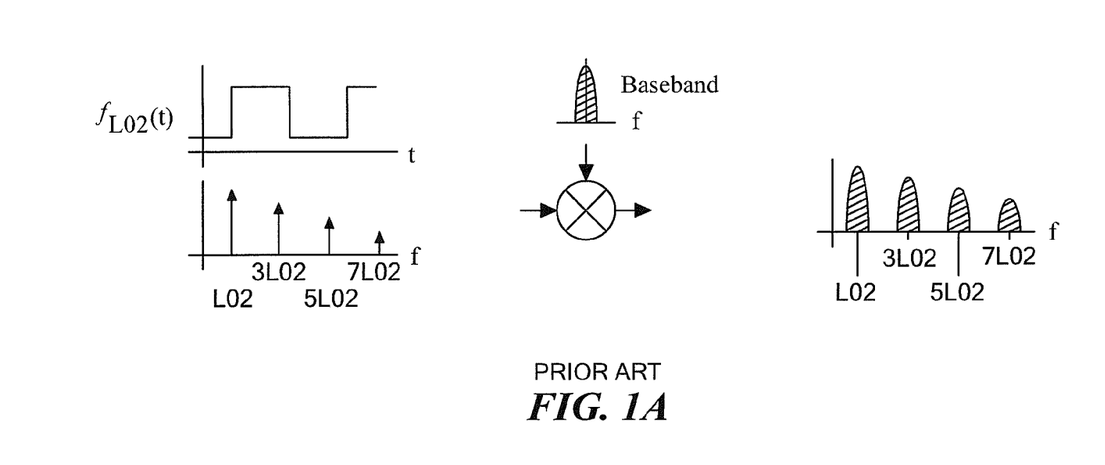
FIGS. 1A and 1B illustrate Local Oscillator (LO) and Output harmonics of conventional and harmonic reject mixers, respectively according to the PRIOR ART.

A significant problem with the compressed LO is the odd harmonic content which will mix with the desired signal and create stray signals at the output of the mixer. The compression of the LO signal can either occur prior to the mixer (for example, in a buffer amplifier), or the compression can occur within the mixer as the input is over driven, or a combination of the two. FIG. 1A shows how copies of the baseband signal will be located at odd multiples of the LO at the output of the mixer. These copies can be reduced by filtering, or as proposed in this document, the $3^{rd}$ and $5^{th}$ harmonics can be reduced by harmonic reject mixing.

Figure 1B:
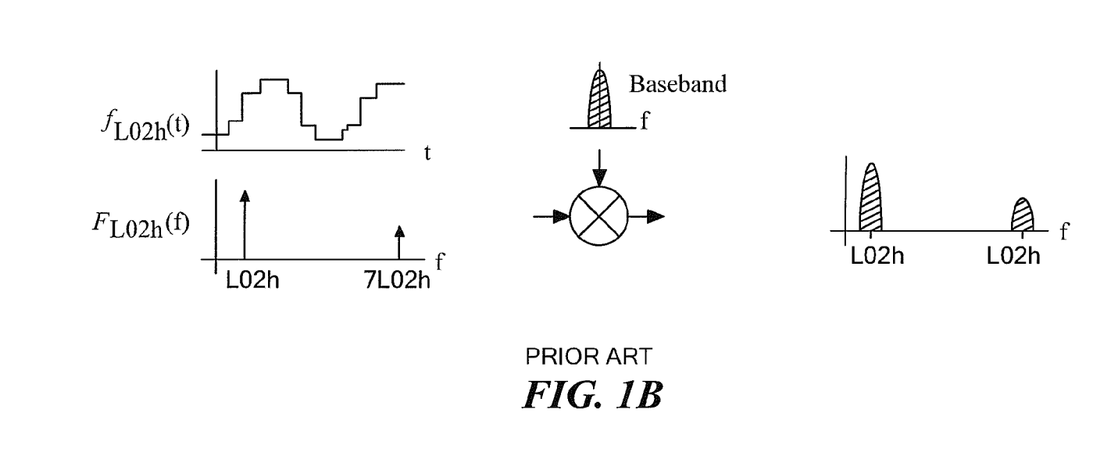

The harmonic reject mixer replaces the single mixer with a combination of three mixers, each fed with a copy of the LO signal that has been shifted in phase. This approximates the behavior of a single mixer replacing the single compressed LO signal with a 3-bit quantized sinusoid signal, as shown in FIG. 1B. The quantized sinusoid signal has its first harmonic at the $7^{th}$ multiple of the fundamental, which greatly eases the filtering requirements for reducing the stray signals at the mixer output [see J. Weldon, et al., "A 1.75-GHz Highly Integrated Narrow-Band CMOS Transmitter with Harmonic-Reject Mixers," IEEE Journal of Solid-State Circuits. Vol. 36, No. 12, pp. 2003-2015, 2001]. The filtering may even be able to be eliminated because the power of the $7^{th}$ multiple of the fundamental is much weaker than the $3^{rd}$ or $5^{th}$ multiples.

Figure 2:
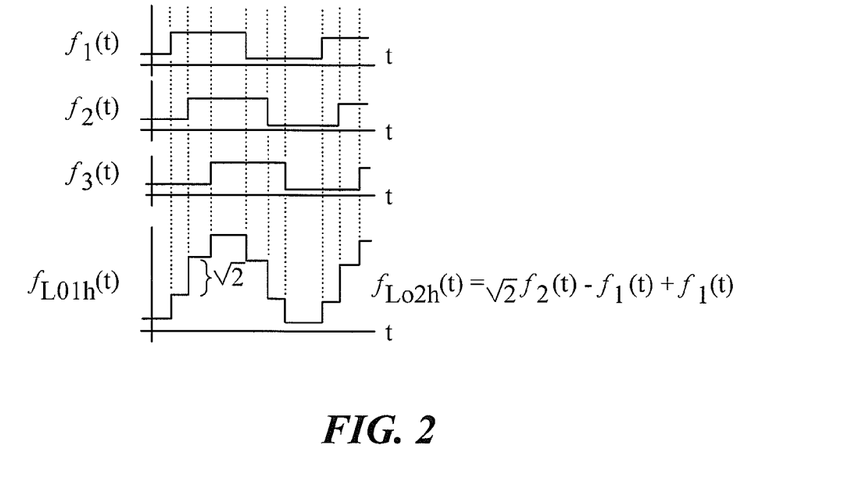
FIG. 2 shows a poly-phase LO signal created from three square waves according to the PRIOR ART.

As mentioned above, the compressed LO signals are desirable because they allow the current-commutating nature of the switching mixers to quickly steer current from one switch to the other while minimizing conversion loss. The quantized sinusoidal signal can be created from compressed waves by summing them together with specific phase shifts (0, 45, 90) and amplitude adjustments, as seen in FIG. 2. The rejection of the $3^{rd}$ and $5^{th}$ harmonics of the compressed waves can be seen by inspecting the Fourier series representation of the scaled and shifted square waves. Summing these three series together, with f2(t) multiplied by sqrt(2) will result in the cancellation of the $3^{rd}$ and $5^{th}$ harmonic terms. In the case of the harmonic reject mixer, the summation of the three signals occurs at the output of the three mixers.

Figure 3:
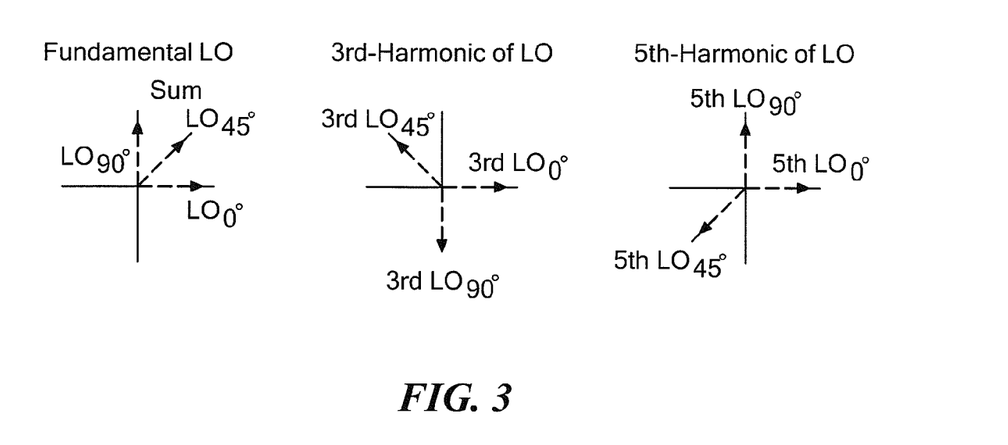
FIG. 3 are diagrams useful in understanding poly-phase LO harmonic cancelation.

Another way to understand the poly-phase mixing, the phase of the third harmonic of the LO changes 3 times faster than that of the fundamental LO [see S. Lerstaveesin, et al., "A 48-860 MHz CMOS Low-IF Direct-Conversion DTV Tuner," IEEE Journal of Solid-State Circuits. Vol. 43, No. 9, pp. 2013-2024. 2008]. The fundamental has the phase offsets of 0, 45, and 90 degrees, so the third harmonic will have phase offsets of 0, 135 and 270 degrees. Notice in the middle diagram of FIG. 3 that the LO vectors of the $3^{rd}$ harmonic sum destructively. The same destructive summing also happens for the $5^{th}$ harmonic.

Figure 4:
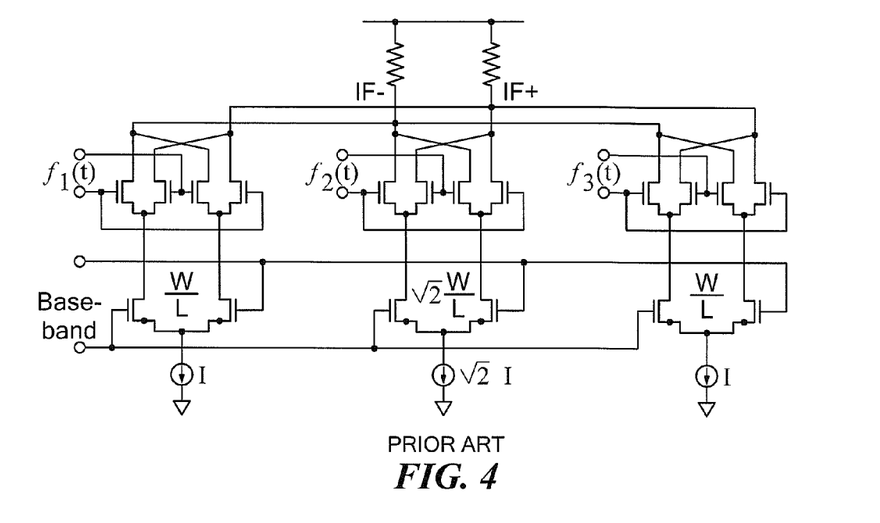
FIG. 4 is a harmonic reject mixer topology according to the PRIOR ART.

The harmonic reject mixer is implemented by feeding each of three parallel double balanced switching mixers with one of the three phase shifted square waves, and summing the output, as shown in FIG. 4. The transconductance stage of each mixer is driven by the baseband signal, and the summing at the output is where the harmonic cancelation occurs. The middle mixer's bias current was increased by a factor of sqrt(2) to increase its gain and provide the sqrt(2) amplitude scaling necessary for the harmonic cancelation. The output signal (IF) is effectively the baseband signal multiplied by the 3-bit amplitude quantized sinusoid.

Figure 5A:
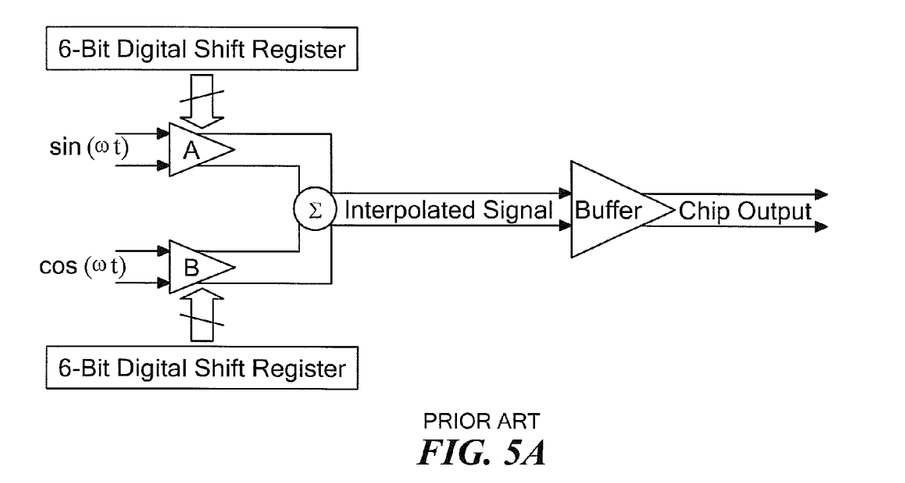
FIG. 5A is a block diagram of phase rotation of a phase rotator according to the PRIOR ART.
Figure 5B:
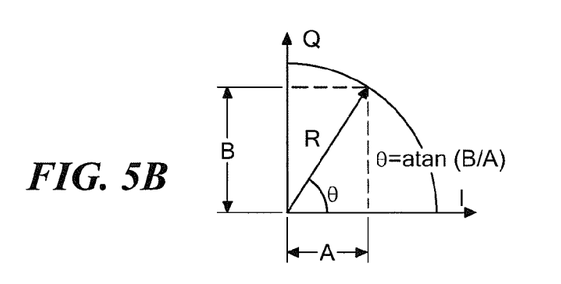
FIG. 5B is a diagram showing vector summation in the phase rotator of FIG. 5A.

As is also known in the art, a phase rotator is based on the concept of a vector modulator, depicted in FIGS. 5A and 5B. The four vectors used are the differential pairs of a cosine and sine, also known as quadrature (0, 90, 180, and 270 in phase). Each differential pair is fed to an independent variable gain transconductance amplifier, with the capability to multiply by negative values by swapping the differential inputs to the gain stage. After the input quadrature voltages are amplified and converted into current, the currents are summed and converted back into a voltage in either a configuration of passive devices or an output buffer. The resulting amplitude and phase of the output signal is determined by the gain and sign assigned to the quadrature inputs, producing a signal with amplitude R and phase θ as depicted in FIG. 5B. [see H. Wang and A. Hajimiri, "A Wideband CMOS Linear Digital Phase Rotator," IEEE 2007 Custom Integrated Circuits Conference (CICC). Vol. TP-30, pp. 1-4, 2007]

Figure 6:
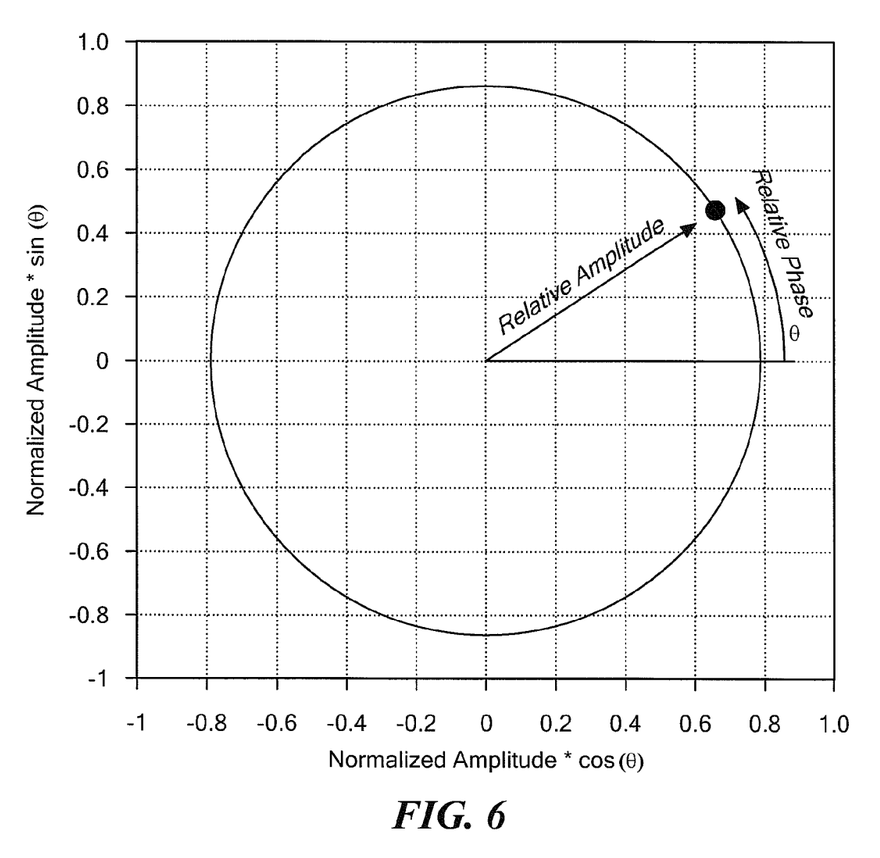
FIG. 6 is a constellation diagram showing one possible amplitude and phase combination from phase rotator of FIG. 5A.

FIG. 6 shows a more complete representation of how a single phase rotator setting relates to a nominal reference state, resulting in a relative amplitude and phase shift. For discussion, it will here be assumed that the reference state for the phase rotator is the state defined by the I-path set at maximum positive gain with the Q-path set to zero gain. If one were to plot this reference point on the diagram in FIG. 6, it would be a point residing at (1, 0). To illustrate a phase rotator state other than the reference, FIG. 6 shows a single configuration with a relative amplitude equal to the radius of the blue circle, and a phase shift equivalent to the degrees of rotation from the reference point at (1,0) to the point.

Figure 7:
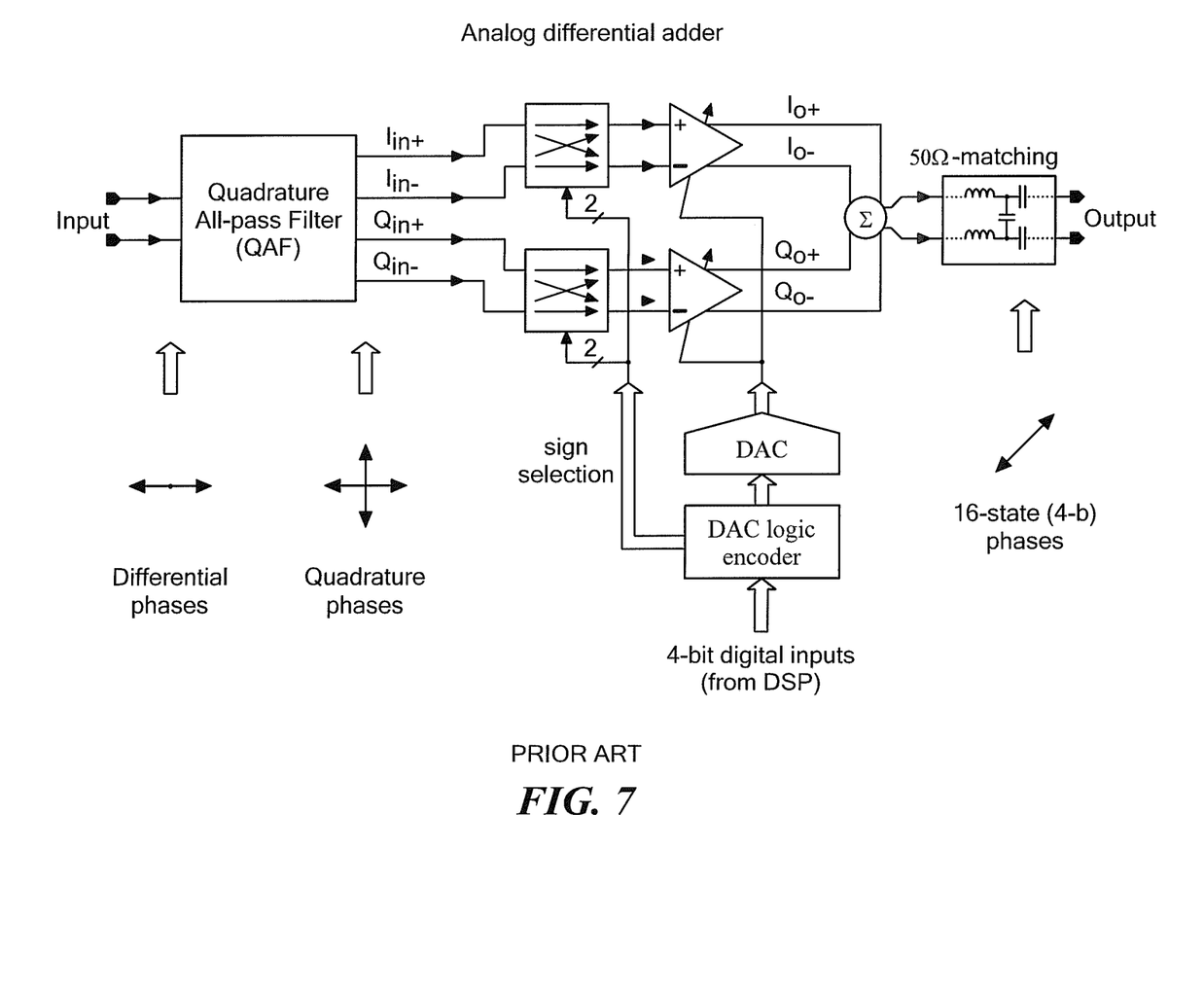
FIG. 7 is a schematic diagram of phase rotator used in conjunction with a quadrature-generation block, output matching network, and supporting digital controls rotator according to the PRIOR ART.

A typical configuration for a phase rotator is shown in FIG. 7. For compatibility with differential circuits, a circuit to produce quadrature signals from a single differential pair is often used. In the example, a quadrature all-pass filter performs this function, but a poly phase circuit or other active or passive techniques can be used in its place [see K. Koh and G. Rebeiz, "0.13-um CMOS Phase Shifters for X-, Ku-, and K-Band Phased Arrays," IEEE Journal of Solid State Circuits, Vol. 42, No. 11, pp. 2535-2546, 2007]. Inside the analog differential adder, the input signal is optionally shifted by 180 degrees by routing the differential pair such that the two signals swap paths. These signals are then amplified by two separate variable-gain amplifiers (one of the in-phase or "I" path, another for the quadrature or "Q" path). To produce the output, the signals are summed together as described previously and in this case the output is matched to a 50 ohm characteristic impedance with a configuration of passive lumped elements. In this particular example, the variable gain amplifiers are comprised of digitally-selectable gain states and a logic encoder to map digital input signals to specific states that correspond to desired phase shifts. The harmonic reject mixer requires that the three phase shifted square waves have a very specific phase delay (0, 45, 90) and amplitude scaling (1, sqrt(2), 1) for ideal cancellation of the $3^{rd}$ and $5^{th}$ harmonics.

Amplitude and phase mismatch in the LO path can come from a number of areas, including: layout differences, passive component tolerances, and LO generation method [see N. Moseley, et al., "A Two-Stage Approach to Harmonic Rejection Mixing Using Blind Interference Cancellation," *IEEE Transactions on Circuits and Systems-II: Express Briefs*. Vol. 55, No. 10, pp. 966-970. 2008]. Most designs try to minimize the mismatch with good layout practices or by increasing the size of the devices so that mismatch constitutes a smaller percent of the device's total area. These methods are sensitive to process variation, require more area and more DC and LO power to drive the devices. These methods are also usually limited to around 40 dBc of harmonic rejection [see S. Lerstaveesin, et al., "A 48-860 MHz CMOS Low-IF Direct-Conversion DTV Tuner," *IEEE Journal of Solid-State Circuits*. Vol. 43, No. 9, pp. 2013-2024. 2008]. Other methods of phase/gain LO mismatch compensation have been proposed that use either digital or analog compensation in the signal path [see N. Moseley, et al., "A Two-Stage Approach to Harmonic Rejection Mixing Using Blind Interference Cancellation," *IEEE Transactions on Circuits and Systems-II: Express Briefs*. Vol. 55, No. 10, pp. 966-970. 2008 and H. Cha, et al., "A CMOS Harmonic Rejection Mixer with Mismatch Calibration Circuitry for Digital TV Tuner Applications," *IEEE Microwave and Wireless Components Letters*. Vol. 18, No. 9, pp. 617-619. 2008]. The analog compensation method uses adjustable resistors in and between the signal paths before the summing at the output of the mixer. These programmable resistors adjust small amounts of gain mismatch to improve the harmonic rejection. The digital method uses sensors and a digital algorithm to generate a cancellation signal through a digital to analog converter, and combines the error signal with the mixer output to minimize the interference.

The inventors have recognized that better harmonic rejection in the mixer can be achieved by using a phase rotator to provide small amounts of phase and gain adjustment in the LO path. The phase rotator can produce large shifts in phase in addition to fine tuning, which makes it useful to provide the necessary 45 and 90 degree phase shifts as well. Finally, the phase rotator can account for I/Q mismatch if this "Harmonic Reject Mixer with Active Mismatch Compensation in the Local Oscillator Path" is used in an image reject transmitter or receiver topology, as show in FIG. 10 (transmitter). With this method and system, two quadrature LO signals (LO1 and LO2 for double up conversion) may be distributed to the harmonic mixers of stage 2 and mixers of stage 1. A set of three phase rotators provide the necessary coarse phase shift (0, 45, 90), fine phase and amplitude mismatch adjustments, and fine I/Q phase mismatch adjustments for the harmonic mixers in stage 2. A single phase rotator may provide the fine I/Q phase mismatch adjustment for the mixer in stage 1. This combination of mixers and gain/phase adjustment greatly improve harmonic and image rejection of this transmitter.

This method and system of compensating a harmonic reject mixer is digitally tunable due to the phase rotators digital control, and may be combined with an algorithm and/or analog sensors to automatically manage the image rejection. The compact layout of the phase-rotator allows it to be used three times with each harmonic reject mixer without significantly increasing the die area. The phase rotator can also be digitally compensated to maintain a given phase shift over a range of LO frequencies, which allows the harmonic reject mixer and gain/phase mismatch compensation to operate in wideband transmitter or receiver architectures.

The combination of a harmonic reject mixer and a phase rotator in the LO path enables good harmonic rejection to be maintained in an environment of non-ideal LO generation techniques, or mismatches in the LO path resulting from manufacturing process, temperature, and tolerance variation. This method and system also allows harmonic rejection to be maintained over varying local oscillator frequencies, which makes this mixer suitable for wide-band transmitter or receiver architectures. If this mixer and mismatch compensation were used in an image reject transmitter or receiver topology, the same mismatch compensation method may be used to eliminate I/Q mismatch, and improve the image rejection of that transmitter or receiver. Previous methods rely on increasing device sizes and power consumption, precise layout, or compensation in the signal path.

In accordance with one embodiment of the disclosure, a harmonic rejection mixer is provided having: a plurality of phase rotators fed by a common local oscillator signal, such local oscillator signal having a reference frequency, each one of the phase rotator output signals having a common frequency related to the reference frequency and having different relative phase shifts; and a plurality of mixer sections, each one of the mixer sections being fed an input and a corresponding one of the plurality of output signals to mix the input signal with the corresponding one of the plurality of output signals fed thereto.

In one embodiment, a combiner is provided for combining the mixer signal from the plurality of mixer sections into a composite output signal.

In one embodiment, a detector is provided for detecting energy in a harmonic of the composite signal and for adjusting the output signal of the phase rotator to reduce the selected harmonic of the composite signal.

In one embodiment, a harmonic rejection mixer is provided having: a plurality of phase rotators fed by a common input local oscillator signal having a reference frequency, each one of the phase rotators separating the common local oscillator signal into a pair of channels with an in-phase signal in one of the channels having a ninety degree phase shift relative to a quadrature signal in the other one of the channels, each one of the channels providing a selected gain to the in-phase signal and quadrature signal therein and wherein the phase rotator combines the gain provided in-phase signal and quadrature signal to produce a composite local oscillator signal having a selected one of a plurality of phase shifts relative to the common input local oscillator signal; and a plurality of mixer sections, each one of the mixer sections being fed the composite local oscillator signal of a corresponding one of the plurality of phase rotators and a common input signal to translate the frequency of the input signal by a frequency related to frequency of the local oscillator signal.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 8A:
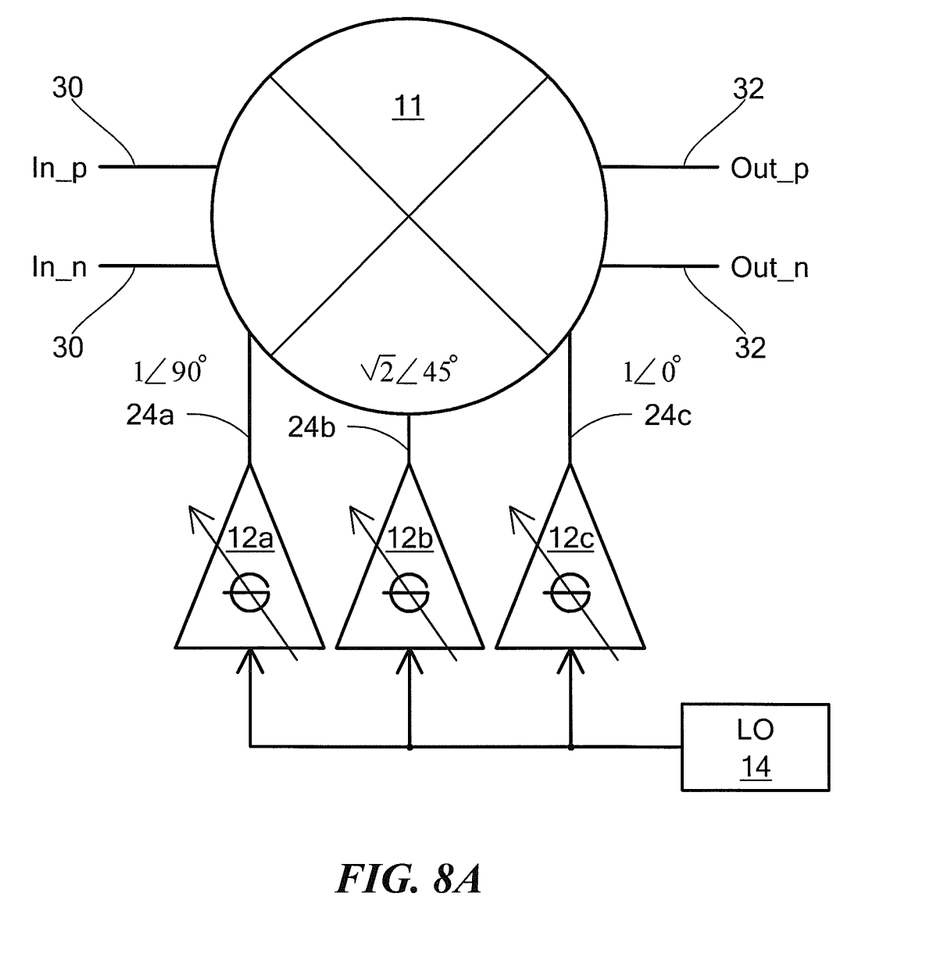
FIG. 8A is a block diagram of a Harmonic Reject Mixer with Phase Rotators in the LO Path according to the disclosure.
Figure 8B:
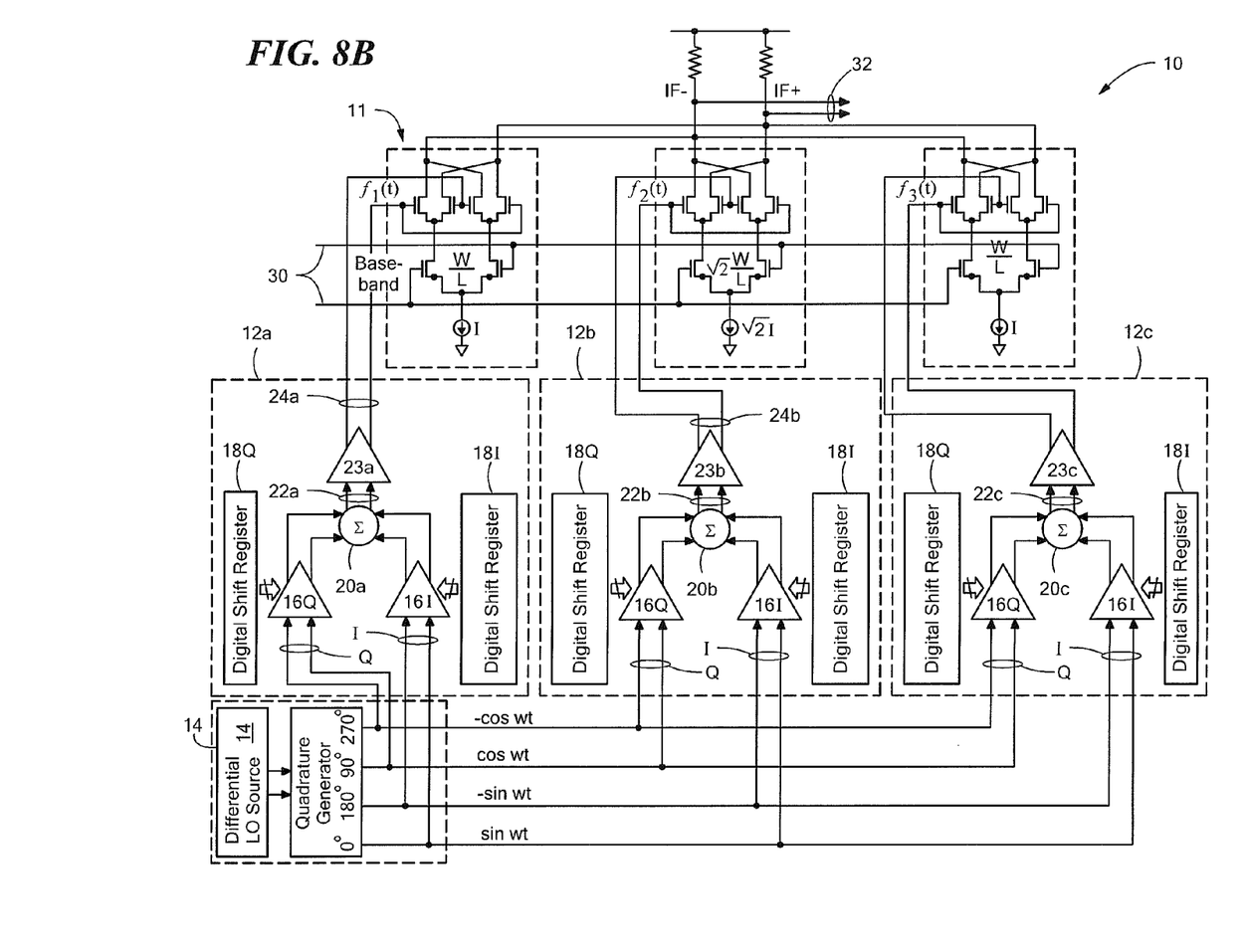
FIG. 8B is a more detailed block diagram the Harmonic Reject Mixer of FIG. 8A according to the disclosure.

Referring now to FIGS. 8A and 8B, a harmonic reject mixer 10 with phase rotators in the LO path is shown having: a plurality of, here three, phase rotators 12a-12c fed by a common input local oscillator (LO) 14 signal (here a quadrature signal produced by passing a differential signal from a LO source through a quadrature generator) having a reference frequency. Thus, four signals are produced by the LO 14 each being the same frequency and shifted in phase one from the other by ninety degrees; i.e., .a zero degree phase shift signal (0); a ninety degree phase shift signal (90); a one hundred eighty degree phase shifted signal (180) and a two hundred seventy degree phase shifted signal (270), as indicated The a zero degree phase shift signal (0) and the ninety degree phase shift signal (90) are in the in-phase channel (I) and are fed to a variable gain digital amplifier 16I while the a one hundred eighty degree phase shifted signal (180) and a two hundred seventy degree phase shifted signal (270) are in the quadrature channel (Q) and are fed to a variable gain digital amplifier 16Q, as indicated, Thus, each one of the phase rotators 12a-12c separates the common local oscillator signal into a pair of channels, I and Q with an in-phase signal (I), here each one being a differential signal, in one of the channels having a ninety degree phase shift relative to a quadrature signal (Q) in the other one of the channels. Each one of the channels passes, as indicated above, through a digitally controlled amplifier 16I, 16Q respectively. The gain provided by the amplifier 16I, 16 Q is established by a digital word stored in a corresponding a pair of digital registers 18I, 18Q, respectively. Thus, each one of the channels provides a selected gain to the in-phase signal and quadrature signal therein. Each one of the phase rotators 12-12c includes a combiner 20a-20c, respectively, as shown, to combine the gains provided the in-phase signal and in the quadrature signal to produce a composite local oscillator signal 24a-24c, respectively, (here each being a differential signal) having the same frequency, a selected one of a plurality of phase shifts relative to the common input local oscillator signal produced by the local oscillator 14. Thus, each one of the phase rotators 12-12c produces a phase vector such as shown in FIG. 6.

It is noted that n FIG. 8A, the three phase rotators 24a, 24b and 24c are 45 degrees out of phase with each other (24a is 90 degrees, 24b is 45 degrees, and 24c is 0 degrees). It is also noted that the local oscillator signal 24b (from phase shifter 12b) has an amplitude that is square root of 2 (i.e. 1.4) times greater than the signals 24a and 26c produced by phase shifters 12a and 12c.

The mixer 10 includes a mixer unit 11 having plurality of, here three, mixer sections 28a-28c (FIG. 8B), each one of the mixer sections 28a-28c being fed the composite local oscillator signal 24a-24c, respectively, of a corresponding one of the plurality of phase rotators 12-12c and a common input signal 30, here a radio frequency differential signal, to translate the frequency of the input signal 30 by a frequency related to the reference frequency of the local oscillator signals 24a-24c and produce a differential output signal 32.

With such an arrangement, small amounts of phase error and gain error in the LO path can be adjusted by the digital words stored in the registers 18I and 18Q in each one of the phase rotators 12a-12c. The phase rotators 12a-12c can produce large shifts in phase in addition to fine tuning, which makes it useful to provide the necessary 45 and 90 degree phase shifts as well.

Figure 9:
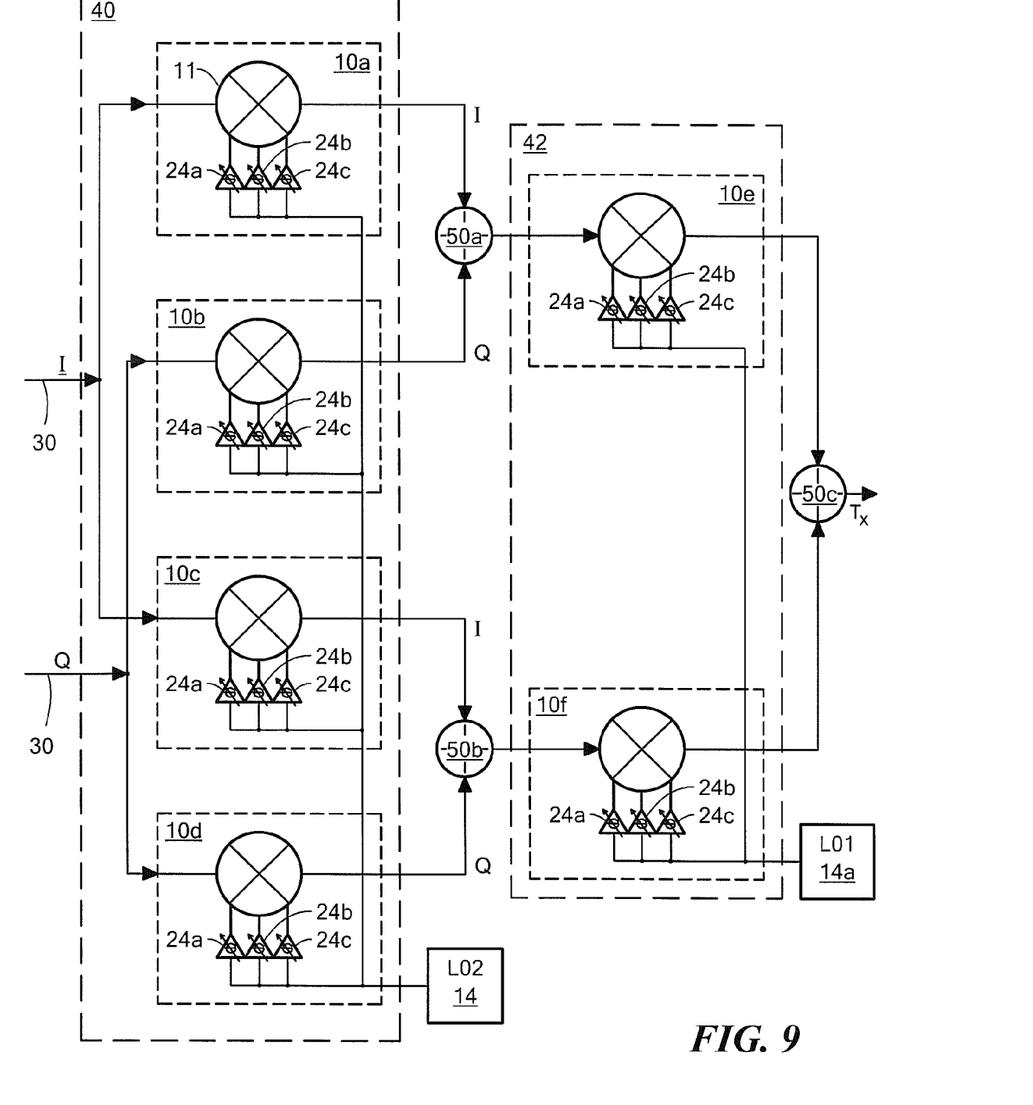
FIG. 9 is a block diagram of harmonic reject mixers with phase rotators in a LO path used in an image reject transmitter with a second stage having harmonic reject mixers with phase rotators used for course phase adjustment, fine gain/phase adjustment, and fine I/Q phase adjustment and with a first stage having mixers with phase rotators for fine I/Q phase adjustment according to the disclosure.

Referring now to FIG. 9, a plurality of the harmonic reject mixers 10 (FIGS. 8A and 8B), here labeled 10a-10d are shown in a first stage 40 with phase rotators 24a-24c in a LO path fed by LO 14 used in an image reject transmitter with a second stage 42 having harmonic reject mixers 10e and 10f with phase rotators 24a-24c fed by a second LO 14a, More particularly, the in-phase I channel of the input signal 30 feeds harmonic reject mixers 10a and 10c and the quadrature Q channel of the input signal 30 feeds harmonic reject mixers 10b and 10d, as shown, The outputs of mixers 10a and 10b are combined in a summer 50a to produce one phase vector and the outputs of mixers 10c and 10d are combined in a summer 50b to produce a second phase vector. The phase vector procured by summer 50a is fed to mixer 10d and the phase vector procured by summer 50b is fed to mixer 10e. The output of mixer 10d is combined with the output of mixer 10e in a summer 50c to produce the final output signal.

Such an arrangement may be used that stage 42 is used for the total system phase shift for a receiver or transmitter used in a larger system, for example, in a phased array antenna system. For downconverting receivers, it may be desirable to retain the harmonic reject mixer behavior of stage 42 while using conventional mixers for each of the four harmonic mixers shown in stage 40. Because the frequency of LO1 in stage 42 is typically much lower than the frequency used in LO2, the $3^{rd}$ and $5^{th}$ harmonics associated with stage 42 poses a significantly higher threat than the $3^{rd}$ and $5^{th}$ harmonics associated with stage 40 as the harmonic products may lie within the passband of the desired signal. The same is true for upconverting transmitters, where the harmonics associated with stage 42 would fall much closer to the desired signal than the harmonics associated with 40 (in the upconverting case, the input and output ports of the mixers are exchanged).

It is noted that the three phase shifts in mixer/rotator blocks 10a, need not be in phase with the three phase shifts in mixer/rotator blocks 10*b* or 10*c*, That is, the output phases of the '0' degree rotator in each block (10*a*, 10*b*, etc) in need not be in exact phase with each other. Likewise, the mixer/rotator blocks in the second stage (10*d*, 10*e*) do not need to have the '0' degree rotator in phase with each other, nor with the blocks from the first stage. From a harmonic rejection standpoint, it is most critical to ensure that the phases are maintained consistent within the individual blocks (like in FIG. 8A). However, taking the additional steps to ensure phase relationship are maintained across multiple blocks would enable features that are in addition to harmonic rejection, such as the image rejection provided by a Hartley architecture.

Figure 10:
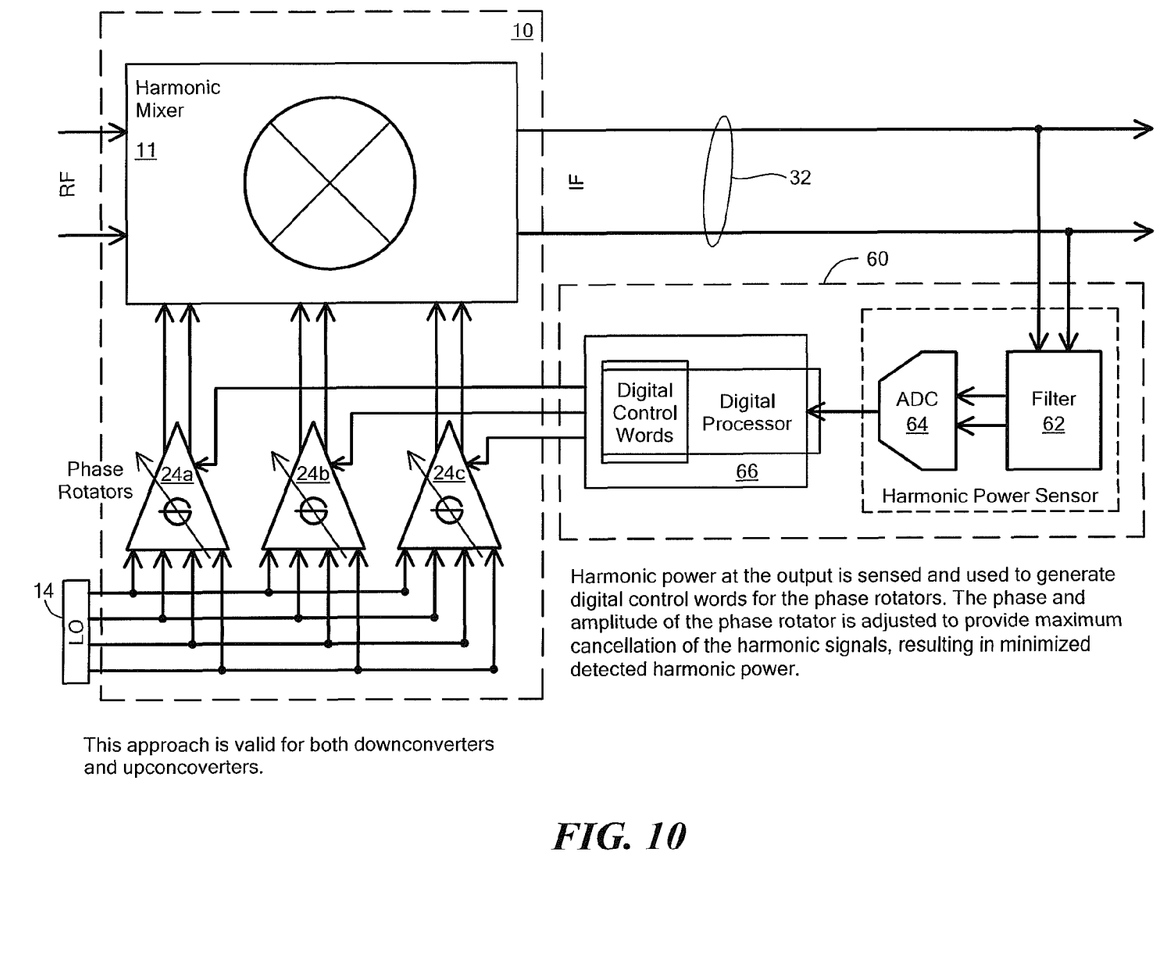
FIG. 10 is a block diagram of a Harmonic Reject Mixer with Phase Rotators in the LO Path having a detector for detecting energy in a harmonic of the composite signal and for adjusting the output signal of the phase rotator to reduce the selected harmonic of the composite signal according to the disclosure.

Referring now to FIG. 10, the mixer 10 is provided with a detector 60 for detecting energy in a harmonic of the composite signal 32 and for adjusting the output signal of the phase rotators 12*a*-12*c* and uses feedback to reduce the selected harmonic of the composite signal 32.

More particularly, the detector 60 includes a narrow band filter 62 tuned to the frequency of the unwanted harmonic of the composite signal 32 (typically the third harmonic). The amount of any energy in the unwanted harmonic is detected and converted to a corresponding digital signal by an analog to digital converter (ADC) 64. The output of the ADC 64 is fed to a digital processor 66 for producing digital words for the phase rotators 12*a*-12*c*, (such digital words being stored in registers 16I and 16Q (FIG. 8B)) to reduce the amount of energy in the unwanted harmonic. Thus, harmonic power at the output is sensed and used to generate digital control words for the phase rotators. The phase and amplitude of the phase rotator is adjusted to provide maximum cancellation of the harmonic signals, resulting in minimized detected harmonic power.

The disclosed system is digitally tunable due to the phase rotators digital control, and may be combined with an algorithm and/or analog sensors to automatically manage the image rejection. The compact layout of the phase-rotator allows it to be used three times with each harmonic reject mixer without significantly increasing the die area. The phase rotator can also be digitally compensated to maintain a given phase shift over a range of LO frequencies, which allows the harmonic reject mixer and gain/phase mismatch compensation to operate in wideband transmitter or receiver architectures.

The combination of a harmonic reject mixer and a phase rotator in the LO path enables good harmonic rejection to be maintained in an environment of non-ideal LO generation techniques, or mismatches in the LO path resulting from manufacturing process, temperature, and tolerance variation. This method also allows harmonic rejection to be maintained over varying local oscillator frequencies, which makes this mixer suitable for wide-band transmitter or receiver architectures. If this mixer and mismatch compensation were used in an image reject transmitter or receiver topology, the same mismatch compensation method could be used to eliminate I/Q mismatch, and improve the image rejection of that transmitter or receiver. Previous methods rely on increasing device sizes and power consumption, precise layout, or compensation in the signal path.

A number of embodiments of the disclosure have been described. Nevertheless, it will be understood that various modifications may be made without departing from the spirit and scope of the disclosure. For example, this disclosure is applicable for both downconverters and upconverters. Accordingly, other embodiments are within the scope of the following claims.

What is claimed is:

1. A harmonic rejection mixer, comprising:
a plurality of phase rotators fed by a common input local oscillator signal having a reference frequency, each one of the phase rotators separating the common local oscillator signal into a pair of channels with an in-phase signal in one of the channels having a ninety degree phase shift relative to a quadrature signal in the other one of the channels, each one of the channels providing a selected gain to the in-phase signal and quadrature signal therein and wherein the phase rotator combines the gain provided in-phase signal and quadrature signal to produce a composite local oscillator signal having a selected one of a plurality of phase shifts relative to the common input local oscillator signal; and
a plurality of mixer sections, each one of the mixer sections being fed the composite local oscillator signal of a corresponding one of the plurality of phase rotators and an input signal to translate the frequency of the input signal by a frequency related to the having a reference frequency of the local oscillator signal.

2. The harmonic rejection mixer recited in claim 1 including a detector for detecting energy in a harmonic of the translated signal and for adjusting the output signal of the phase rotator to reduce the selected harmonic of the translated signal.

* * * * *